United States Patent
Shu et al.

(10) Patent No.: US 10,431,716 B2
(45) Date of Patent: Oct. 1, 2019

(54) LIGHT EMITTING DIODE AND FABRICATION METHOD THEREOF

(71) Applicant: XIAMEN SAN'AN OPTOELECTRONICS CO., LTD., Xiamen (CN)

(72) Inventors: Liming Shu, Xiamen (CN); Da-qian Ye, Xiamen (CN); Liangjun Wang, Xiamen (CN); Xiaofeng Liu, Xiamen (CN); Chaoyu Wu, Xiamen (CN); Duxiang Wang, Xiamen (CN); Dongyan Zhang, Xiamen (CN); Sha-sha Chen, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 15/870,236

(22) Filed: Jan. 12, 2018

(65) Prior Publication Data

US 2018/0138361 A1    May 17, 2018

Related U.S. Application Data

(63) Continuation of application No. PCT/CN2016/111671, filed on Dec. 23, 2016.

(30) Foreign Application Priority Data

Apr. 27, 2016 (CN) .......................... 2016 1 0267717

(51) Int. Cl.
*H01L 33/02* (2010.01)
*H01L 33/08* (2010.01)
(Continued)

(52) U.S. Cl.
CPC ............ *H01L 33/08* (2013.01); *H01L 33/007* (2013.01); *H01L 33/0016* (2013.01);
(Continued)

(58) Field of Classification Search
CPC ........................... H01L 29/30; H01L 31/0248
See application file for complete search history.

(56) References Cited

U.S. PATENT DOCUMENTS

2007/0069226 A1* 3/2007 Kang .................. H01L 33/0095
257/94
2015/0311382 A1* 10/2015 Kim ........................ H01L 33/06
257/13

FOREIGN PATENT DOCUMENTS

JP            104313281 A    11/1992
KR    1020090051470 A     3/2010

* cited by examiner

*Primary Examiner* — Cheung Lee
(74) *Attorney, Agent, or Firm* — Syncoda LLC; Feng Ma

(57) ABSTRACT

A light-emitting diode includes a first-type nitride region, a light-emitting region and a second-type nitride region, wherein the first-type nitride region includes a plurality of alternating first nitride layers and second nitride layers. The second nitride layers have high-doped emitting points pointing to the corresponding first nitride layer. The second-type nitride region includes a plurality of alternating third nitride layers and fourth nitride layers, wherein doping concentration of the fourth nitride layer is higher than that of the third nitride layer, and the fourth nitride layer has high-doped emitting points pointing to the third nitride layer. By adjusting thickness of the second nitride layer and the fourth nitride layer in different growth cycles, and density and form of corresponding emitting points, horizontal expansion of current in the first-type nitride region and the second-type nitride region can be greatly enhanced through alternating emitting points, thereby improving LED performance.

20 Claims, 2 Drawing Sheets

(51) Int. Cl.
  *H01L 33/32* (2010.01)
  *H01L 33/00* (2010.01)
  *H01L 33/14* (2010.01)
  *H01L 33/24* (2010.01)
(52) U.S. Cl.
  CPC ........ *H01L 33/0075* (2013.01); *H01L 33/025* (2013.01); *H01L 33/14* (2013.01); *H01L 33/145* (2013.01); *H01L 33/24* (2013.01); *H01L 33/32* (2013.01); *H01L 33/325* (2013.01)

LIGHT EMITTING DIODE AND FABRICATION METHOD THEREOF

CROSS-REFERENCE TO RELATED APPLICATIONS

The present application is a continuation of, and claims priority to, PCT/CN2016/111671 filed on Dec. 23, 2016, which claims priority to Chinese Patent Application No. 201610267717.1 filed on Apr. 27, 2016. The disclosures of these applications are hereby incorporated by reference in their entirety.

BACKGROUND

Light-emitting diode (LED) is a semiconductor solid light-emitting device, taking semiconductor PN junction as the light-emitting structure. Currently, gallium nitride is regarded as the third-generation III-IV-group semiconductor, which features wide band gap, high light-emitting efficiency and stable chemical property. However, chips driven by large current are still affected by uneven current expansion.

SUMMARY

The inventors of the present disclosure have recognized that, among LED structural designs, it is common to enhance current expansion by alternating growth of high-doped layers and low-doped layers. However, current density of areas near the P electrode or the P-Finger is much higher than that of other areas.

The present disclosure provides an epitaxial wafer design of light-emitting diode and fabrication method thereof. According to a first aspect of the present disclosure, an epitaxial wafer of light-emitting diode is provided, which includes a first-type nitride region, a light-emitting region and a second-type nitride region, wherein the first-type nitride region includes a plurality of first nitride layers and second nitride layers, and the second nitride layer has high-doped emitting points pointing to the corresponding first nitride layer.

According to another aspect of the present disclosure, a fabrication method of the aforementioned light-emitting diode is provided, which includes: 1) forming a first-type nitride region, a light-emitting region and a second-type nitride region; 2) growing a low-doped or non-doped first nitride layer during growth of the first-type nitride region or the second-type nitride region; 3) stopping the input of III and IV sources, and inputting $H_2$ for etching the first nitride layer surface to form nanometer holes; 4) changing growth conditions and switching to the 2D growth mode through high pressure and high rotation speed; and inputting III and IV sources and silicone to fill in nanometer holes over the first nitride layer to form high-doped emitting points; 5) maintaining growth conditions in step 3) and growing the second nitride layer; and repeating steps 2)-5) to form the first-type nitride region.

In some embodiments, doping concentration of the first nitride layer is $1\times10^{17}/cm^3$-$1\times10^{19}/cm^3$, and doping concentration of the second nitride layer is higher than or equals to $1\times10^2/cm^3$.

In some embodiments, the second-type nitride region includes a third nitride layer and a fourth nitride layer, wherein doping concentration of the fourth nitride layer is higher than that of the third nitride layer, and the fourth nitride layer has high-doped emitting points pointing to the third nitride layer.

In some embodiments, the second-type nitride region is formed by: 1) inputting III and IV sources and growing the third nitride layer; 2) stopping the input of III and IV sources, and inputting $H_2$ for etching the third nitride layer surface to form nanometer holes; 3) changing growth conditions and switching to the 2D growth mode through high pressure and high rotation speed; and inputting III and IV sources and Mg source to fill in nanometer holes over the third nitride layer to form high-doped emitting points; 4) maintaining growth conditions in step 3) and growing the fourth nitride layer; and repeating steps 1)-4) to form the second-type nitride region.

In some embodiments, doping concentration of the third nitride layer is $1\times10^{17}/cm^3$-$1\times10^{19}/cm^3$, and doping concentration of the fourth nitride layer is higher than or equals to $1\times10^2/cm^3$.

In some embodiments, number of second nitride layers with emitting points in the first-type nitride region is $\geq 2$; and number of fourth nitride layers with emitting points in the second-type nitride region is $\geq 2$.

In some embodiments, doping concentration of the second nitride layer in the first-type nitride region maintains constant, gradient or Gaussian distribution; and doping concentration of the fourth nitride layer in the second-type nitride region maintains constant, gradient or Gaussian distribution.

In some embodiments, projections of emitting points of adjacent second nitride layers in the first-type nitride region appear in alternating distribution over the light-emitting layer; and projections of emitting points of adjacent fourth nitride layers in the second-type nitride region appear in alternating distribution over the light-emitting layer.

In some embodiments, the first nitride layer and the third nitride layer have a series of holes, and the second nitride layer and the fourth nitride layer fill in the holes, and form the emitting points in the holes.

In some embodiments, the holes are nanometer-scale.

In some embodiments, the first-type nitride region and the second-type nitride region co-exist or either one of them exists in the light-emitting diode.

In some embodiments, the distribution density and depth of nanometer holes are controlled by adjusting $H_2$ input amount and time in step 2).

According to a third aspect of the present disclosure, a light-emitting system including a plurality of light-emitting diodes is provided, wherein each light-emitting diode includes a first-type nitride region; a light-emitting region; and a second-type nitride region; wherein the first-type nitride region comprises a first nitride layer and a second nitride layer, wherein a doping concentration of the second nitride layer is higher than a doping concentration of the first nitride layer; and the second nitride layer has high-doped emitting points pointing to the first nitride layer. The light-emitting system can be used, for example, in lighting, signage, displays, etc.

Various embodiments of the present disclosure can have one or more of the following advantageous effects: insert the second nitride layer and the fourth nitride layer with emitting points in the first-type nitride region and the second-type nitride region; current tends to flow from the second nitride layer and the fourth nitride layer near the electrode to the light-emitting region through emitting points; for this reason, by adjusting thickness of the second nitride layer and the fourth nitride layer in different growth cycles, and density and form of corresponding emitting points, horizontal expansion of current in the first-type nitride region and the second-type nitride region can be greatly enhanced through alternating emitting points, thus improving LED performance.

Figure 1:
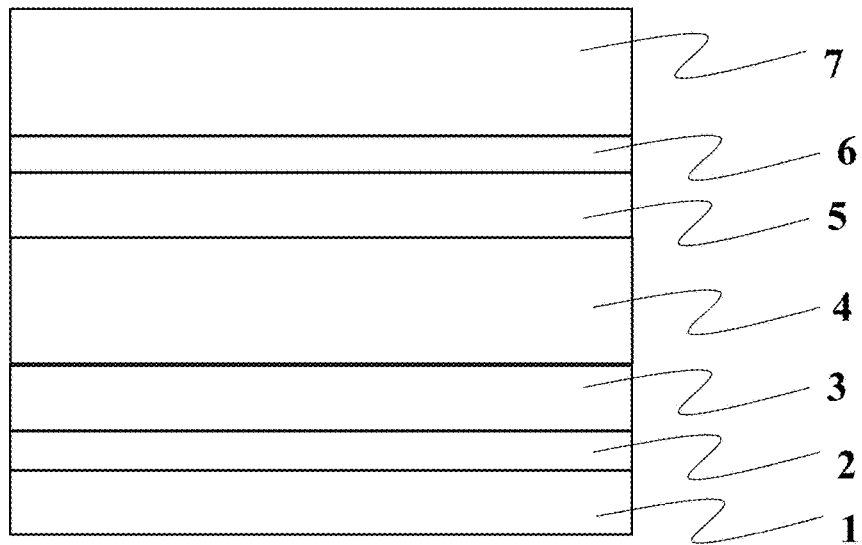
FIG. 1 illustrates a sectional view of the epitaxial wafer of the light-emitting diode according to some embodiments of the present disclosure.
Figure 2:
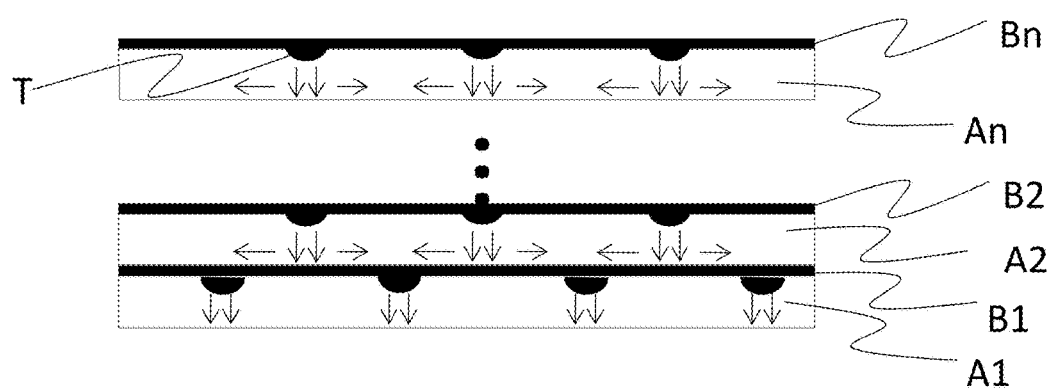
FIG. 2 shows a structural diagram of the first-type nitride region of a light-emitting diode according to Embodiment 1.
Figure 3:
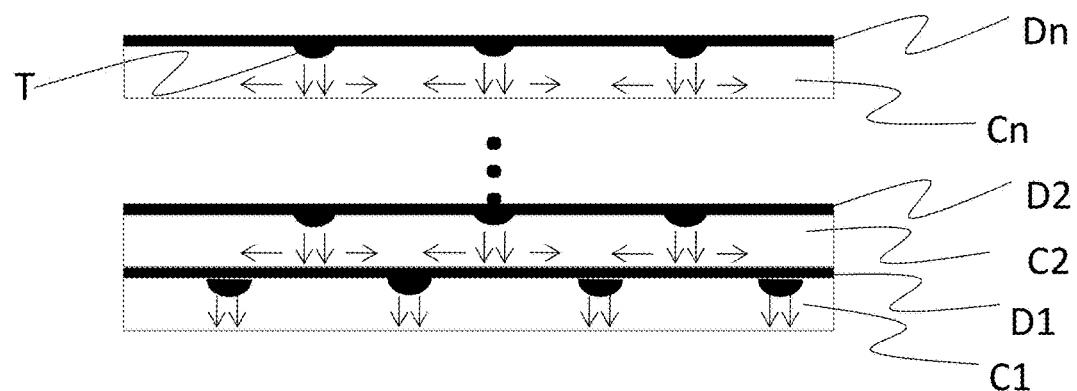
FIG. 3 shows a structural diagram of the second-type nitride region of a light-emitting diode according to Embodiment 1.
Figure 4:
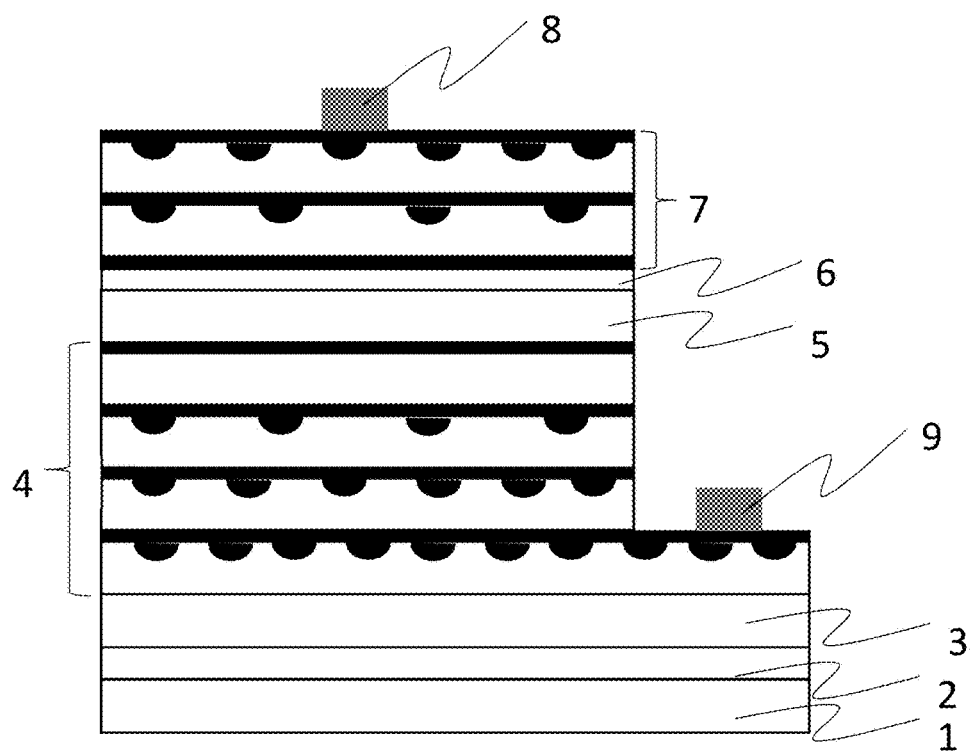
FIG. 4 illustrates a sectional view of an epitaxial structure of the light-emitting diode according to Embodiment 2.

In the drawings: 1. substrate, 2. buffer layer, 3. non-doped nitride layer, 4. first-type nitride region, 5. light-emitting region, 6. electron blocking layer, 7. second-type nitride region, 8. P electrode, 9. N electrode. $A_1$-$A_n$ is a low-doped or non-doped N-type GaN layer, i.e., first nitride layer; $B_1$-$B_n$ is an $N^+$ GaN layer, i.e., second nitride layer; $C_1$-$C_n$ is a low-doped or non-doped P-type GaN layer, i.e., third nitride layer; $D_1$-$D_n$ is a $P^+$ GaN layer, i.e., fourth GaN layer; T means emitting point, and n is number of circulars, wherein n≥2.

DETAILED DESCRIPTION

Various embodiments of the present disclosure will be described in detail with reference to the accompanying drawings to help understand the substantive features and practicability of the present disclosure. It should be noted that, however, specific details disclosed herein are not to be interpreted as limiting the scope of the present disclosure.

Embodiment 1

FIG. 1 illustrates a sectional view of an epitaxial wafer of a light-emitting diode according to the present disclosure. The epitaxial layer fabricated according to the embodiment includes from bottom to up: (1) a sapphire substrate 1; (2) a low-temperature buffer layer 2, which can be combination of GaN, AlN or AlGaN, wherein film thickness is 1-1,000 nm; (3) a non-doped nitride layer 3 with film thickness of 300-7,000 μm, preferably 3,500 μm; (4) a first-type nitride region 4 with thickness over 1 μm; (5) a light-emitting region 5, taking InGaN as the well layer, and GaN or AlGaN or their combination as the barrier layer, wherein the barrier layer is 50-150 nm thick, and the well layer is 1-20 nm thick; (6) an electron blocking layer 6, preferably made of AlGaN with film thickness of 1-50 μm; and 7) a second-type nitride region 7, with thickness of 0.05-1 μm.

A growth process of the first-type nitride region can include: (1) growing a low-doped first nitride layer $A_1$, i.e., N-type GaN layer, with thickness of 10-50 nm and preferred doping concentration of $5\times10^{18}/cm^3$; (2) stopping the input of III, IV-group Mo sources, and inputting about 50 L $H_2$ for 10-100 min, preferably 50 min to form nanometer holes with density of about $2\times10^{12}$ pcs/cm²; (3) continuing the input of III, IV-group Mo sources and silicone, and adjusting reaction chamber pressure above 500 torr and rotation speed above 1,200 rmp/min, wherein doping concentration is $1\times10^{20}/cm^3$ and maintains constant, and growth rate is 1 μm/h; filling in the etched nanometer holes formed in step (2) via 2D growth to form emitting point T, wherein depth of the emitting point is less than ½ $A_1$, preferably ⅓ $A_1$; (4) keeping conditions in step (3) for 5-50 min to form a second nitride layer $B_1$, i.e., $N^+$ GaN layer; repeating steps (1)-(4) to grow the first nitride region, wherein number of repetitions n≥2, preferably n=10.

A growth process of the second-type nitride region can include: (1) growing a third nitride layer $C_1$, i.e., P-type GaN layer, with thickness of 1-50 nm and preferred doping concentration of $1\times10^{17}/cm^3$-$1\times10^{18}/cm^3$; (2) stopping the input of III, IV-group Mo sources, and inputting about 25 L $H_2$ for 10-100 min, preferably 20 min to form nanometer holes with density of about $5\times10^{12}$ pcs/cm²; (3) stopping input of $H_2$ and continuing the input of III, IV-group Mo sources and Mg source, and adjusting reaction chamber pressure above 500 torr and rotation speed above 1,000 rmp/min, wherein doping concentration is $1\times10^2/cm^3$ and maintains constant, and growth rate is 0.1 μm/h; filling in the etched nanometer holes formed in step (2) via 2D growth to form emitting point T, wherein depth of the emitting point is less than ½ $C_1$, preferably ⅓ $C_1$; (4) keeping conditions in step (3) for 1-50 min to form a fourth nitride layer $D_1$, i.e., $P^+$ GaN layer; repeating steps (1)-(4) to grow the second-type nitride region, wherein number of repetitions n≥2, preferably n=10.

At last, take thermal annealing for the epitaxial layer at 450° C. nitrogen environment.

According to a first embodiment of the present disclosure, in the growth step (3) of the first-type nitride region and the second-type nitride region, form irregular-distributed nanometer holes over the N-type GaN layer and P-type GaN layer through the corruption of the epitaxial layer by $H_2$; and form a 2D-mode $N^+$ GaN layer and a $P^+$ GaN layer to fill in the holes, thus forming high-doped emitting points; as n≥2, i.e., the first-type nitride region and the second-type nitride region have a multi-layer structure, and emitting points are distributed over different layers with no specific rules, and projections of emitting points in different cycles of the first-type nitride region and the second-type nitride region on the light-emitting layer are not completely overlapped; as electrons tend to flow from the $N^+$ GaN layer in the $(n-1)^{th}$ cycle to the $N^+$ GaN layer in the $n^{th}$ cycle via the emitting point, while holes tend to flow from the $P^+$ GaN layer in the $n^{th}$ cycle to the $P^+$ GaN layer in the $(n-1)^{th}$ cycle through the emitting point, horizontal expansion of current in the first-type nitride region and the second-type nitride region are greatly enhanced by alternating emitting points in different cycles, thus improving LED performance.

As a first variant of this embodiment, adjust growth processes in step (3) and step (4) of the first-type nitride region, wherein silicane input amount appears high-low gradient so that doping concentration of the second nitride layer in the same circle appears high-low gradient; in this case, doping concentration is preferably changed from $5\times10^{21}/cm^3$ to $1\times10^{20}/cm^3$. In this way, the emitting point and the nearby $N^+$ GaN layer have high doping concentration, which improves electron expansion capacity, and injection efficiency of electrons from the $(n-1)^{th}$ $N^+$ GaN layer to the $n^{th}$ GaN layer.

As a second variant of this embodiment, adjust growth processes in step (3) and step (4) of the second-type nitride region, wherein Mg source input amount appears high-low gradient so that doping concentration of the second nitride layer in the same cycle appears high-low gradient; in this case, doping concentration is preferably changed from $2\times10^{21}/cm^3$ to $1\times10^2/cm^3$. In this way, the emitting point and nearby $P^+$ GaN layer have high doping concentration, which improves hole expansion capacity, and injection efficiency of holes from the $n^{th}$ P$^+$ GaN layer to the $(n-1)^{th}$ P$^+$ GaN layer.

Embodiment 2

Different from Embodiment 1, in this embodiment, in different growth cycles of the first-type nitride region, in step 3), H$_2$ input amount gradually decreases from 60 L to 10 L, and input time gradually decreases from 60 min to 10 min; in different growth cycles of the second-type nitride region, in step 3), H$_2$ input amount is gradually increases from 5 L to 30 L, and input time gradually increases from 10 min to 30 min; preferably, n is 10.

In this embodiment, in the first-type nitride region, as n increases, nanometer holes in different growth cycles gradually get smaller, so do the emitting points; in the second-type nitride region, as n increases, nanometer holes in different growth cycles gradually get larger, so do the emitting points.

In the chip fabrication process of this embodiment, when the N electrode and the P electrode are injected to the first and the second-type nitride regions, in the initial stage, initial carriers are much guided by the emitting point carriers, and free expansion capacity is weak; therefore, horizontal expansion is sufficient; as the emitting points approaching the light-emitting region get smaller, carriers, after sufficient guidance expansion, have stronger free expansion capacity. After twice free expansion, expansion capacity of carriers is enhanced.

As a first variant of this embodiment, in different growth cycles of the first-type nitride region, as n increases, doping concentration of the N$^+$ GaN layer gradually decreases; and in different growth cycles of the second-type nitride region, as n increases, doping concentration of the P$^+$ GaN layer gradually increases. That means, the design goal of Embodiment 2 can be achieved through gradient change of doping concentrations of emitting points and through guidance change of carriers by emitting points with different concentrations.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode, comprising:
   a first-type nitride region composed of an n-type nitride;
   a light-emitting region; and
   a second-type nitride region;
   wherein:
   the first-type nitride region comprises a first nitride layer and a second nitride layer;
   a doping concentration of the second nitride layer is higher than a doping concentration of the first nitride layer; and
   the second nitride layer has high-doped emitting points pointing to the first nitride layer to thereby improve electron expansion capacity and injection efficiency.

2. The light-emitting diode of claim 1, wherein the doping concentration of the first nitride layer is $1\times10^{17}/cm^3$-$1\times10^{19}/cm^3$.

3. The light-emitting diode of claim 1, wherein the doping concentration of the second nitride layer is higher than or equals to $1\times10^{20}/cm^3$.

4. The light-emitting diode of claim 1, wherein the second-type nitride region comprises a third nitride layer and a fourth nitride layer, wherein a doping concentration of the fourth nitride layer is higher than a doping concentration of the third nitride layer, and the fourth nitride layer has high-doped emitting points pointing to the third nitride layer.

5. The light-emitting diode of claim 4, wherein the doping concentration of the third nitride layer is $1\times10^{17}/cm^3$-$1\times10^{19}/cm^3$.

6. The light-emitting diode of claim 4, wherein the doping concentration of the fourth nitride layer is higher than or equals to $1\times10^{20}/cm^3$.

7. The light-emitting diode of claim 4, wherein a number of the second nitride layers with emitting points in the first-type nitride region is 2; and a number of the fourth nitride layers with emitting points in the second-type nitride region is $\geq 2$.

8. The light-emitting diode of claim 7, wherein the doping concentration of the second nitride layers in the first-type nitride region maintain constant, change gradually, or take Gaussian distribution; and the doping concentration of the fourth nitride layers in the second-type nitride region maintain constant, change gradually, or take Gaussian distribution.

9. The light-emitting diode of claim 7, wherein projections of emitting points of adjacent second nitride layers in the first-type nitride region on the light-emitting layer are not completely coincided; and projections of emitting points of adjacent fourth nitride layers in the second-type nitride region on the light-emitting layer are not completely coincided.

10. The light-emitting diode of claim 4, wherein the first nitride layer and the third nitride layer have a series of holes, and the second nitride layer and the fourth nitride layer fill in the holes, and form the emitting points in the holes.

11. The light-emitting diode of claim 10, wherein the holes are in nanometer scale.

12. A fabrication method of a light-emitting diode, the method comprising: forming n-type nitride as a first-type nitride region, a light-emitting region and a second-type nitride region, wherein the first-type nitride region comprises a first nitride layer and a second nitride layer, wherein a doping concentration of the second nitride layer is higher than that of the first nitride layer; and the second nitride layer has high-doped emitting points pointing to the first nitride layer to thereby improve electron expansion capacity and injection efficiency.

13. The fabrication method of claim 12, wherein the fabrication method of the first-type nitride region comprises:
   1) inputting III and IV sources to grow the first nitride layer;
   2) stopping the input of III and IV sources, and inputting H$_2$ for etching the first nitride layer surface to form nanometer holes;
   3) changing growth conditions and switching to a 2D growth mode through high pressure and high rotation speed; and inputting III and IV sources and silicane to fill in nanometer holes over the first nitride layer to form high-doped emitting points;

4) maintaining growth conditions in step 3) and growing the second nitride layer; and repeating steps 1)-4) to form the first-type nitride region.

14. The fabrication method of claim 13, wherein a distribution density and a depth of nanometer holes are controlled by adjusting $H_2$ input amount and time in step 2).

15. The fabrication method of claim 12, wherein the second-type nitride region comprises a third nitride layer and a fourth nitride layer, wherein a doping concentration of the fourth nitride layer is higher than that of the third nitride layer; and the fourth nitride layer has high-doped emitting points pointing to the third nitride layer.

16. The fabrication method of claim 15, wherein the fabrication method of the second-type nitride region comprises:

1) inputting III and IV sources to grow the third nitride layer;

2) stopping the input of III and IV sources, and inputting $H_2$ for etching the third nitride layer surface to form nanometer holes;

3) changing growth conditions and switching to a 2D growth mode through high pressure and high rotation speed; and inputting III and IV sources and Mg source to fill in nanometer holes over the third nitride layer to form high-doped emitting points;

4) maintaining growth conditions in step 3) and growing the fourth nitride layer; and repeating steps 1)-4) to form the second-type nitride region.

17. The fabrication method of claim 16, wherein a distribution density and depth of nanometer holes are controlled by adjusting $H_2$ input amount and time in step 2).

18. A light-emitting system including a plurality of light-emitting diodes, wherein each light-emitting diode comprises:

a first-type nitride region composed of n-type nitride;

a light-emitting region; and a second-type nitride region;

wherein:

the first-type nitride region comprises a first nitride layer and a second nitride layer;

a doping concentration of the second nitride layer is higher than a doping concentration of the first nitride layer; and the second nitride layer has high-doped emitting points pointing to the first nitride layer to thereby improve electron expansion capacity and injection efficiency.

19. The light-emitting system of claim 18, wherein the second-type nitride region comprises a third nitride layer and a fourth nitride layer, a doping concentration of the fourth nitride layer is higher than a doping concentration of the third nitride layer, and the fourth nitride layer has high-doped emitting points pointing to the third nitride layer.

20. The light-emitting system of claim 19, wherein the first nitride layer and the third nitride layer have a series of holes, and the second nitride layer and the fourth nitride layer fill in the holes, and form the emitting points in the holes.

* * * * *